United States Patent [19]

Okamoto

[11] Patent Number: 5,781,489
[45] Date of Patent: Jul. 14, 1998

[54] SEMICONDUCTOR STORAGE DEVICE

[75] Inventor: Toshiharu Okamoto, Tokyo, Japan

[73] Assignee: NEC Corporation, Tokyo, Japan

[21] Appl. No.: 866,270

[22] Filed: May 30, 1997

[30] Foreign Application Priority Data

May 30, 1996 [JP] Japan ............... 8-137148

[51] Int. Cl.$^6$ ............... G11C 7/02
[52] U.S. Cl. ............... 365/208; 365/207; 365/210
[58] Field of Search ............... 365/208, 207, 365/205, 185.2, 210

[56] References Cited

U.S. PATENT DOCUMENTS

| | | | |
|---|---|---|---|
| 5,198,997 | 3/1993 | Arakawa | 365/208 |
| 5,621,686 | 4/1997 | Alexis | 365/208 |
| 5,642,308 | 6/1997 | Yoshida | 365/185.12 |

*Primary Examiner*—Vu A. Le
*Attorney, Agent, or Firm*—Sughrue, Mion, Zinn, Macpeak & Seas, PLLC

[57] ABSTRACT

The invention provides a semiconductor storage device which realizes such reliability that a current characteristic does not exhibit a variation even after use thereof over a long period of time without increasing the circuit area and the chip size. A non-volatile memory wherein an NMOS transistor of the stack gate type having a floating gate is used for a memory cell transistor and a sense amplifier of the differential amplification type is used employs an NMOS transistor of the single gate type for a reference cell transistor as a dummy memory cell in order to obtain a reference voltage for the sense amplifier. An intermediate potential obtained by voltage division by capacitance elements connected in series is supplied as a gate voltage to the reference cell transistor. The capacitances of the capacitance elements are set so that the ratio between them may be substantially equal to the capacitance ratio of the memory cell transistor.

4 Claims, 7 Drawing Sheets

PRIOR ART

SEMICONDUCTOR STORAGE DEVICE

BACKGROUND OF THE INVENTION

1. Field of the Invention

This invention relates to a semiconductor storage device, and more particularly to an electronically writable and erasable non-volatile semiconductor storage device.

2. Description of the Related Art

Conventionally, a sense amplifier of the differential amplification type is normally used for an electronically writable and erasable non-volatile semiconductor storage device.

FIG. 5 is a circuit diagram of part of a conventional semiconductor storage device of the type mentioned and shows only those logic gates and elements necessary for description of the semiconductor storage device. Referring to FIG. 5, the semiconductor storage device shown includes a sense amplifier 3 having a pair of differential inputs a and b. Connected to the differential input a of the sense amplifier 3 is a circuit which includes a memory cell transistor (MCT) 1, a column selection transistor (column selection T) 2, an invertor 12I1, an NMOS transistor 11N1 and a PMOS transistor 10P1. The memory cell transistor 1 is connected to be driven by a word line and is connected at the source thereof to the ground. The column selection transistor 2 is connected at the source thereof to the drain of the memory cell transistor 1 and is switched on when it receives a column selection signal at the gate thereof. The source of the NMOS transistor 11N1 is connected to the gate of the NMOS transistor 11N1 via the invertor 12I1 and connected also to the drain of the column selection transistor 2. The drain of the PMOS transistor 10P1 is short-circuited to the gate of the PMOS transistor 10P1 and connected to the drain of the NMOS transistor 11N1, and a power supply voltage VCC is supplied to the source of the PMOS transistor 10P1. A signal at the drain (common junction) of the PMOS transistor 10P1 (NMOS transistor 11N1) is inputted to the differential input a of the sense amplifier 3. In the circuit described above, the memory cell transistor 1 is a stack gate type transistor having a floating gate and can assume two states of an erase state wherein no electron is injected into the floating gate and a write state wherein electrons are injected into the floating gate. Meanwhile, the column selection transistor 2 functions, in a reading operation, to render the bit line when selected conducting in response to a column selection signal supplied to the gate thereof.

Meanwhile, another circuit is connected to the other differential input b of the sense amplifier 3 and includes a reference cell transistor 8, an NMOS transistor 11N3, an invertor 12I2, an NMOS transistor 11N2 and a PMOS transistor 10P2. The reference cell transistor 8 is formed from a same device as that of the memory cell transistor 1 and is connected at the gate thereof to receive a control signal CNT and connected at the source thereof to the ground. The NMOS transistor 11N3 is connected at the source thereof to the drain of the reference cell transistor 8 and is connected at the gate thereof to receive the power supply voltage VCC. The source of the NMOS transistor 11N2 is connected to the gate of the NMOS transistor 11N2 via the invertor 12I2 and also to the drain of the NMOS transistor 11N3. The drain of the PMOS transistor 10P2 is short-circuited to the gate of the PMOS transistor 10P2 and connected to the drain of the NMOS transistor 11N2, and the source of the PMOS transistor 10P2 is connected to receive the power supply voltage VCC. A signal at the drain (common junction) of the PMOS transistor 10P2 (NMOS transistor 11N2) is inputted to the differential input b of the sense amplifier 3. In the circuit just described, the reference cell transistor 8 is kept in an erase state wherein no electron is injected into the floating gate so that the NMOS transistor 11N3 functions, in a reading operation, to normally make the dummy bit line conducting.

A reading operation of the semiconductor storage device having such a basic construction as described above will be described below.

When a reading operation is started, a high ("H") level is applied to the control line (control signal) CNT. Thereupon, since the reference cell transistor 8 is in an erase state, the NMOS transistor 11N3 is rendered conducting. Consequently, the potential (that is, b potential) at the junction between the PMOS transistor 10P1 and the NMOS transistor 11N2 begins to drop via the NMOS transistors 11N3 and 11N2. Soon, the potential is stabilized at a certain level by a balance with the PMOS transistor 10P2 which functions as a load resistor. This potential level is referred to as VREF.

Then, as a "H" level is applied from the word line, the memory cell transistor 1 is selected.

Here, if the memory cell transistor 1 is in an erase state and becomes conducting, then the potential at the differential input a to the sense amplifier 3 begins to drop. However, the potential at the differential input a is soon stabilized at a certain level by a balance with the PMOS transistor 10P1 which functions as a load resistance. This potential level is referred to as VON.

On the other hand, if the memory cell transistor 1 is in a write state and is non-conducting, then the bit line potential and the potential at the differential input a begin to rise. In this instance, the potentials rise up to a level defined also by a threshold level (VTP) of the PMOS transistor 10P1 which functions as a load resistor, that is, to VCC - VTP. This potential level is represented by VOFF.

The sense amplifier 3 compares the input a (VON or VOFF) from the memory cell transistor 1 and the input b (VREF) from the reference cell transistor 8 with each other and outputs, for example, a "H" level (or "1") from a sense output SO thereof when the input a is equal to or higher than the potential VREF, but outputs a low level ("L" or "0") from the sense output SO when the input a is lower than the potential VREF. Whether the data at the memory cell transistor 1 is "1" or "0" can be read out in this manner.

The potential VREF mentioned above is set so that it satisfies a relationship of VOFF>VREF>VON in order that reading may be performed by differential amplification. Here, the potentials VOFF, VON and VREF are set by adjusting the current capacities of the PMOS transistors 10P1 and 10P2. However, a dimension of the reference cell transistor 8 may be adjusted to adjust the current capacity of the reference cell transistor 8 to set the potential VREF. In short, the potential VREF may be set by any method only if the relationship of VOFF>VREF>VON given above is satisfied.

Where the reference cell transistor 8 and the memory cell transistor 1 are formed from a same device in this manner, since the reference cell transistor 8 and the memory cell transistor 1 have a same current characteristic, the sense amplifier which employs differential amplification operates ideally. However, where an electrically writable and erasable stack gate type NMOS transistor is used, if a voltage is applied to the device for reading over a long period of time, then electrons are injected into the floating gate. Consequently, the current characteristic of the device is varied and this varies the potential VREF, which gives rise to a problem that the sense amplifier 3 cannot output desired data.

In order to eliminate the problem just described, a write circuit or an erase circuit may be provided to keep or adjust the current characteristic of the reference cell transistor 8 to the current characteristic exhibited in an erase state by the reference cell transistor 8. Naturally, however, this gives rise to a new problem that the circuit area is increased and consequently the chip area is increased.

In one of possible methods to eliminate the problem described above which arises from the reference cell transistor 8 for which a same device as the memory cell transistor 1 is used, an NMOS transistor of the single gate type which is used in peripheral circuits is used for the reference cell transistor 8. In this instance, however, although the problem that the current characteristic is varied by a variation of the threshold level by application of a read bias voltage over a long period of time is cleared, a different problem arises from the fact that the characteristic between the drain current (ID) and the gate voltage (VG) is different between the stack gate type memory cell transistor 1 and the single gate type reference cell transistor 8.

FIG. 6 is a current characteristic diagram of the memory cell and reference cell transistors illustrating the last-mentioned problem. As seen in FIG. 6, it is assumed here that the threshold level voltage of the memory cell transistor 1 in an erasure state is, for example, 3 V, the threshold level voltage of the memory cell transistor 1 in a write state is, for example, 7 V, and the threshold level voltage of the reference cell transistor 8 is, for example, 1 V. The characteristic MCTA in this instance is an ID-VG characteristic of the memory cell transistor 1 in an erase state, and the characteristic MCTB is an ID-VG characteristic in a write state. Similarly, the characteristics RCTA and RCTB are ID-VG characteristics of the reference cell transistor 8, and the slopes of them can be adjusted by adjusting a dimension of the reference cell transistor 8, for example, the gate width. It is to be noted that the characteristic RCTA here is set such that it may be, for example, approximately one third the current value of the memory cell transistor 1 when the voltage VG is 4 V. As described hereinabove, in this instance, a method of adjusting a dimension of the reference cell transistor 8 to adjust the current capacity of the reference cell transistor 8 in order that the relationship of VOFF>VREF>VON may be satisfied is employed.

However, since the threshold level of the memory cell transistor 1 and the threshold level of the reference cell transistor 8 are different from each other, the characteristic MCTA of the memory cell transistor 1 and the characteristic RCTA of the reference cell transistor 8 are different in rise voltage and exhibit current values whose relationship is reversed across an intersecting point X between them. At a voltage lower than the intersecting point X, no reading is performed. Further, the lower limit to the voltage with which reading is performed normally is a power supply voltage higher than the intersecting point X taking a margin into consideration. For example, the lower limit is 3.5 V. Consequently, there is a problem that the voltage range within which an ordinary reading operation is possible is narrowed.

In order to increase the range, it may seem a promising idea, for example, to adjust a dimension of the reference cell transistor 8 to decrease the slope of the characteristic like the characteristic RCTB to shift the intersecting point to a lower voltage side. This, however, gives rise to another problem that the balance between the reading speed of the memory cell transistor 1 in an on-state and the reading speed of the memory cell transistor 1 in an off-state is lost or, since it becomes difficult to assure a margin from the current value of the memory cell transistor 1 in an off-state, the reliability in reading is deteriorated.

FIG. 7 is a circuit diagram of an ordinary gate voltage generation circuit. Referring to FIG. 7, the gate voltage generation circuit shown adjusts a gate voltage to be supplied to the gate of a reference cell transistor 8 in order to adjust the ID-VG characteristic of the reference cell transistor 8 to that of the memory cell transistor 1 of the stack gate type. In this instance, the gate voltage generation circuit includes a PMOS transistor 10P which is controlled on and off by a control signal supplied to the gate thereof and resistance elements R1 and R2, and applies an arbitrary intermediate voltage produced by voltage division by the resistance elements R1 and R2 to the gate of the reference cell transistor 8 for which an NMOS transistor of the single gate type is used. Where this gate voltage generation circuit is used, since the rise voltage can be suitably adjusted, a reading operation can be performed regularly even with a low voltage in the proximity of a threshold level voltage (for example, 3 V) of the memory cell. However, where the countermeasure just described is taken, it becomes required to set the resistance value high in order to eliminate production of through current, and this increases the circuit area and hence increases the chip size.

In this manner, the conventional semiconductor storage devices described above are disadvantageous in that, if it is tried to improve the ID-VG characteristic, then a circuit area and a chip size are increased or some other problem arises.

SUMMARY OF THE INVENTION

It is an object of the present invention to provide a semiconductor storage device which realizes such reliability that a current characteristic does not exhibit a variation even after use thereof over a long period of time without increasing the circuit area and the chip size.

In order to attain the object described above, according to the present invention, there is provided a semiconductor storage device, comprising a memory cell transistor formed from an NMOS transistor of the stack gate type having a floating gate, a word line signal being supplied to the gate of the memory cell transistor, a column selection transistor connected to the memory cell transistor, a column selection signal being supplied to the gate of the column selection transistor, first and second capacitance elements connected in series between a power supply and the ground, a reference transistor formed from an NMOS transistor of the single gate type, a potential at a junction between the first and second capacitance elements being supplied to the gate of the reference transistor in order to obtain a reference voltage from the reference transistor, a discharge transistor connected to the gate of the reference transistor, and a sense amplifier for comparing a voltage on the memory cell transistor side received via the column selection transistor with a voltage on the reference transistor side to differentially amplify the voltage on the memory cell transistor side, the first and second capacitance elements having capacitances which have a ratio substantially equal to a capacitance ratio of the memory cell transistor.

Preferably, minimum gate voltages with which on-current flows through the memory cell transistor and the reference transistor are equal to each other.

The semiconductor storage device may be constructed such that the discharge transistor is formed from an NMOS transistor and operates with a first control signal supplied to the gate thereof while the first and second capacitance elements supply a high level or a low level of a second control signal via a control invertor to vary the potential at the junction between the first and second capacitance elements to control the gate voltage to the reference transistor.

Or, the semiconductor storage device may be constructed such that the reference transistor is formed from an NMOS transistor of the stack gate type same as that of the memory cell transistor, and the control gate and the floating gate of the reference transistor are short-circuited to each other.

With the semiconductor storage device, when the reference side voltage for the sense amplifier is to be produced, even if an NMOS transistor of the single gate type is used for the reference transistor, the same current-voltage characteristic as that of the memory cell transistor which is formed from an NMOS transistor of the stack gate type can be realized. Consequently, the semiconductor device is advantageous in that, even after use over a long period of time, such reliability that the current characteristic does not exhibit a variation is assured, and a reference voltage characteristic of a high degree of accuracy can be obtained with a simple circuit construction without increasing the chip size.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

Figure 1:
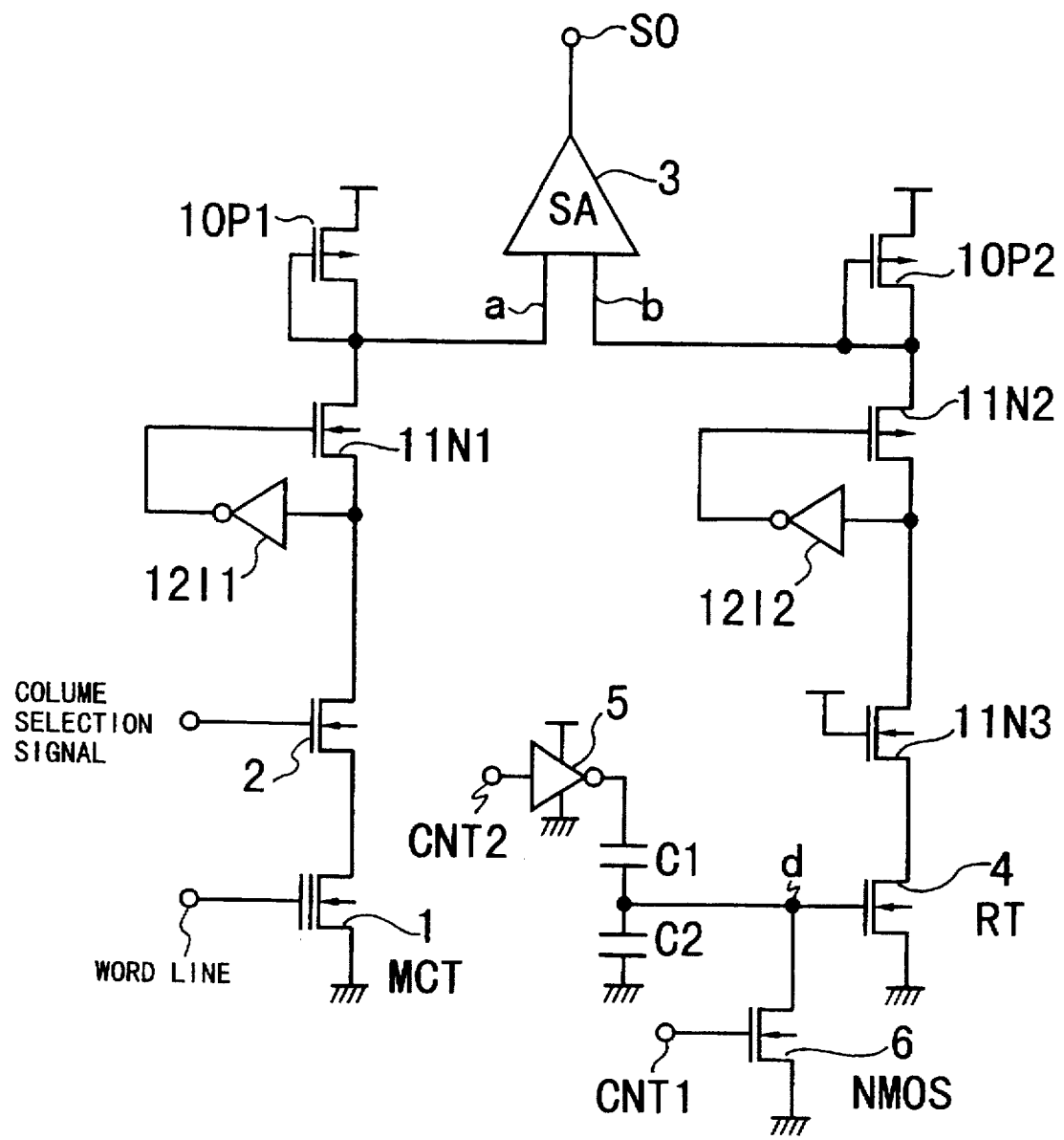
FIG. 1 is a circuit diagram of part of a semiconductor storage device to which the present invention is applied.

Referring first to FIG. 1, there is shown in circuit diagram part of a semiconductor storage device to which the present invention is applied. Referring to FIG. 1, the semiconductor storage device shown is formed as a non-volatile memory wherein an NMOS transistor of the stack gate type having a floating gate is used for a memory cell transistor 1 and adopts differential amplification for a sense amplifier 3. Further, in order to obtain a reference voltage for the sense amplifier 3, an NMOS transistor of the single gate type is used for a dummy memory cell transistor (RT) 4, and an intermediate voltage obtained by voltage division by capacitance elements C1 and C2 connected in series is applied as a gate voltage to the dummy memory cell transistor 4.

Figure 5:
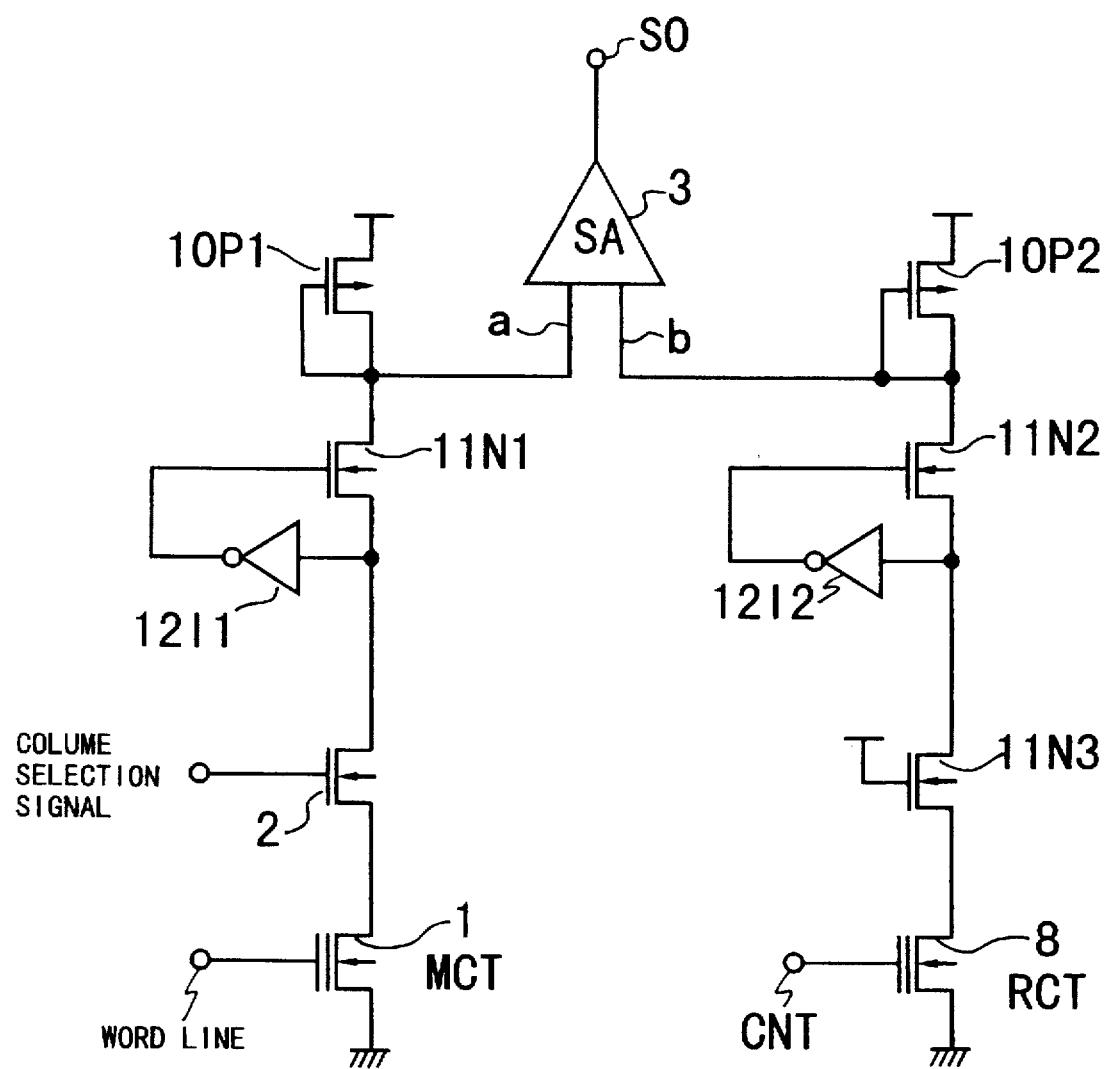
FIG. 5 is a circuit diagram of part of a conventional semiconductor storage device.
Figure 6:
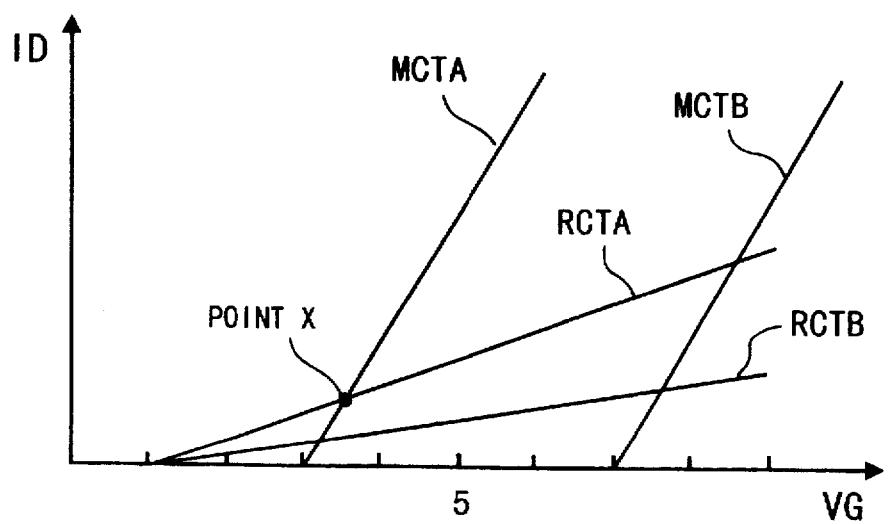
FIG. 6 is a diagram illustrating current characteristics of memory cell and reference cell transistors of the semiconductor storage device shown in FIG. 5.

Also in FIG. 1, only logic gates and elements necessary for description of the semiconductor memory device of the present embodiment are shown similarly as in FIG. 5 which shows the conventional semiconductor storage device described above. Also in the semiconductor storage device shown in FIG. 1, connected to a differential input a of the sense amplifier 3 is a circuit which includes a memory cell transistor (MCT) 1, a column selection transistor (column selection T) 2, an invertor 12I1, an NMOS transistor 11N1 and a PMOS transistor 10P1. The memory cell transistor 1 is connected to be driven by a word line and is connected at the source thereof to the ground. The column selection transistor 2 is connected at the source thereof to the drain of the memory cell transistor 1 and is switched on when it receives a column selection signal at the gate thereof. The source of the NMOS transistor 11N1 is connected to the gate of the NMOS transistor 11N1 via the invertor 12I1 and connected also to the drain of the column selection transistor 2. The drain of the PMOS transistor 10P1 is short-circuited to the gate of the PMOS transistor 10P1 and connected to the drain of the NMOS transistor 11N1, and a power supply voltage VCC is supplied to the source of the PMOS transistor 10P1. A signal at the drain (common junction) of the PMOS transistor 10P1 (NMOS transistor 11N1) is inputted to the differential input a of the sense amplifier 3. In the circuit described above, the memory cell transistor 1 is a stack gate type transistor having a floating gate and can assume two states of an erase state wherein no electron is injected into the floating gate and a write state wherein electrons are injected into the floating gate. Meanwhile, the column selection transistor 2 functions, in a reading operation, to render the bit line when selected conducting in response to a column selection signal supplied to the gate thereof.

Meanwhile, another circuit is connected to the other differential input b of the sense amplifier 3 and includes a reference cell transistor 4, a control invertor 5, capacitance elements C1 and C2, a discharge NMOS transistor 6, an NMOS transistor 11N3, an invertor 12I2, an NMOS transistor 11N2 and a PMOS transistor 10P2. The reference cell transistor 4 is formed, different from the memory cell transistor 1, from a single gate NMOS transistor, and is connected at the gate thereof to a node d to receive a control signal CNT at the node d and connected at the source thereof to the ground. The control invertor 5 is connected to a control line CNT2. The capacitance elements C1 and C2 are connected in series between an output terminal of the control invertor 5 and the ground, and the intermediate node d between the capacitance elements C1 and C2 is connected to the gate of the dummy memory cell transistor 4. The discharge NMOS transistor 6 is connected at the drain thereof to the node d between the capacitance elements C1 and C2 and connected at the gate thereof to another control line CNT1. The NMOS transistor 11N3 is connected at the source thereof to the drain of the dummy memory cell transistor 4 and is connected at the gate thereof to receive the power supply voltage VCC. The source of the NMOS transistor 11N2 is connected to the gate of the NMOS transistor 11N2 via the invertor 12I2 and also to the drain of the NMOS transistor 11N3. The drain of the PMOS transistor 10P2 is short-circuited to the gate of the PMOS transistor 10P2 and connected to the drain of the NMOS transistor 11N2, and the source of the PMOS transistor 10P2 is connected to receive the power supply voltage VCC. A signal at the drain (common Junction) of the PMOS transistor 10P2 (NMOS transistor 11N2) is inputted to the differential input b of the sense amplifier 3. In the circuit just described, the electrode of the capacitance element C1 on the high potential side is connected to the output terminal of the control invertor 5 so that the NMOS transistor 11N3 functions, in a reading operation, to normally make the dummy bit line conducting.

Figure 2:
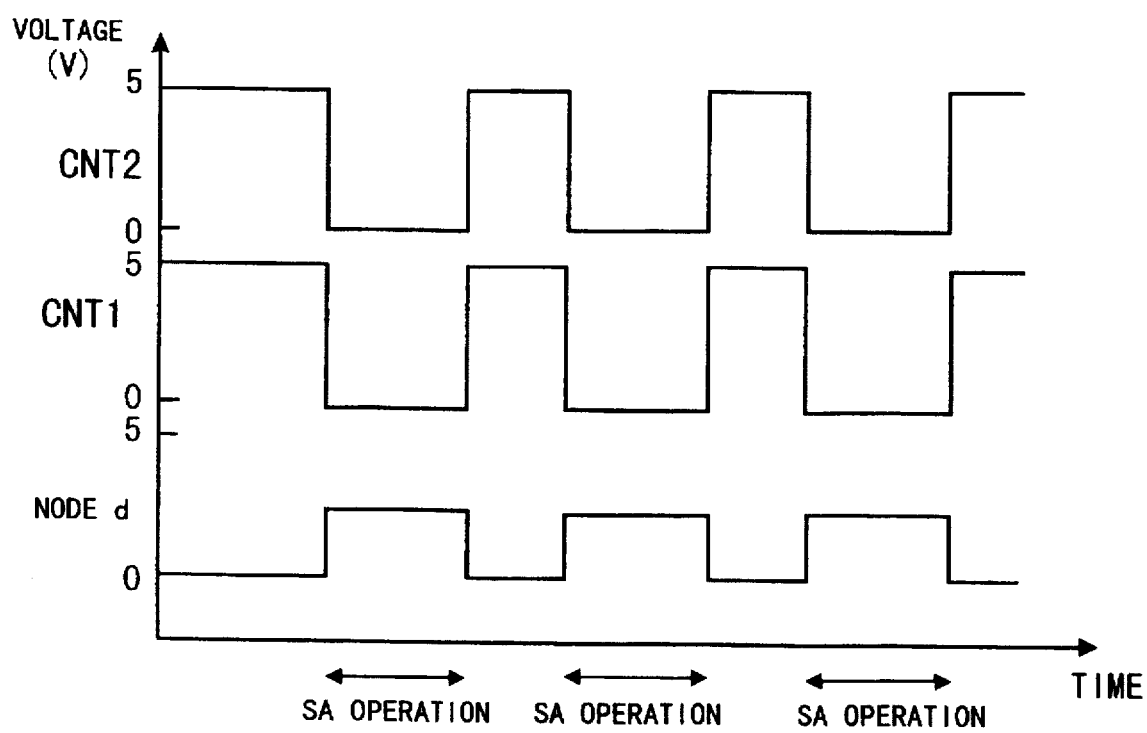
FIG. 2 is a timing chart showing signal waveforms in the semiconductor storage device.

FIG. 2 is a timing chart illustrating different signals of the semiconductor storage device of FIG. 1. As seen from FIG. 2, when the control lines CNT1 and CNT2 are both at a low level ("L"), the node d exhibits a high level ("H"), and in this instance, the sense amplifier 3 performs a sense amplification operation (SA operation). It is to be noted that, since the control lines CNT1 and CNT2 are set so that they have a 5 V at a "H" level but 0 V at a "L" level, the node d exhibits an intermediate voltage at a "H" level and 0 V at a "L" level.

Since the signals CNT1 and CNT2 for controlling the gate voltage to the dummy memory cell transistor 4 can be realized using voltages required to control the sense amplifier 3, there is no necessity of adding new circuits for production of the control signals.

A reading operation of the semiconductor storage device having such a basic construction as described above will be described below.

When a reading operation is started, a "L" level is applied to the control line (control signal) CNT1 so that the discharge NMOS transistor 6 is rendered nonconducting. Then, when a "L" level s applied to the control line CNT2, the control invertor 5 is rendered conducting to the power supply voltage VCC and changes its level to a "H" level, and consequently, the potential at the node d rises to an intermediate potential which depends upon a capacitance ratio of the capacitance elements C1 and C2. The capacitance ratio of the capacitance elements C1 and C2 should be set so that the ID (drain current) - VG (gate voltage) characteristic of the dummy memory cell transistor 4 may be substantially same as the ID-VG characteristic of the memory cell transistor 1. It is to be noted that the ID-VG characteristic of a MOS transistor which is based on voltage division by the capacitance elements C1 and C2 will be hereinafter described in detail with reference to FIG. 3.

As described hereinabove, as the potential at the node d rises, the dummy memory cell transistor 4 becomes conducting, and consequently, the potential at the differential input b to the sense amplifier 3 begins to drop via the NMOS transistors 11N3 and 11N2. However, the potential at the differential input b is stabilized at a certain level by a balance with the PMOS transistor 10P2 which functions as a load resistor. This potential level is referred to as VREF.

Then, when a "H" level is applied to the word line to the memory cell transistor 1, the memory cell transistor 1 is selected. The memory cell transistor 1 provides the potential at the differential input a which is different whether it is in an erase state or a write state.

First, when the memory cell transistor 1 is in an erase state, the memory cell transistor 1 is rendered conducting by the word line (H level) signal, and the potential to the memory cell transistor 1 begins to drop via the column selection transistor 2 and the NMOS transistor 11N1 connected on the bit line. However, the potential at the memory cell transistor 1 is soon stabilized at a certain level by a balance with the PMOS transistor 10P1 which functions as a load resistor. This potential level is referred to as VON.

On the other hand, when the memory cell transistor 1 is in a write state and is non-conducting, the potential of the bit line which connects the column selection transistor 2 to whose gate a column selection signal is supplied and the memory cell transistor 1 to each other and the differential input a begin to increase. The bit line potential and the differential input a rise up to a potential defined also by a threshold level of the PMOS transistor 10P1 which functions as a load capacitance. This potential level is referred to as VOFF.

Thereafter, the sense amplifier 3 compares the input a (VON or VOFF) from the memory cell transistor 1 and the input b (VREF) from the dummy memory cell transistor 4 with each other and outputs, for example, a "H" level (or "1") to a sense output SO thereof if the input a is equal to or higher than the input b, but outputs a "L" level (or "0") if the input a is lower than the input b.

Whether the data of the memory cell transistor 1 is "1" or "0" can be read out in this manner. Here, the potential VREF is set so that it satisfies a relationship of VOFF>VREF>VON in order to allow reading out by differential amplification.

Finally, after the reading out operation principally by the operation of the sense amplifier 3 is completed, a "H" level is applied to the control line CNT1. Consequently, the discharge NMOS transistor 6 is rendered conducting to change the potential at the node d to a "L" level. Thereafter, a "H" level is applied also to the control line CNT2, and the control invertor 5 outputs an "L" level.

One cycle of sense amplification operation of FIG. 2 is completed this manner. The semiconductor storage device successively repeats a similarly operation for different bit lines to complete a series of reading operations.

The setting of the relationship among the potentials given above may be realized by adjusting the driving capacities of the PMOS transistors 10P1 and 10P2 which function as load elements or by adjusting the current capacity of the dummy memory cell transistor 4. In short, any measure may be taken only if the potentials can be set so that they may satisfy the relationship of VOFF>VREF>VON.

In the present embodiment, since the current characteristic of the dummy memory cell transistor 4 can be set so that the gate voltage at which current begins to flow may be equal to that of the memory cell transistor 1, the voltage supply range in which normal reading is possible with the sense amplifier 3 can be increased comparing with those of conventional semiconductor storage devices.

Figure 3:
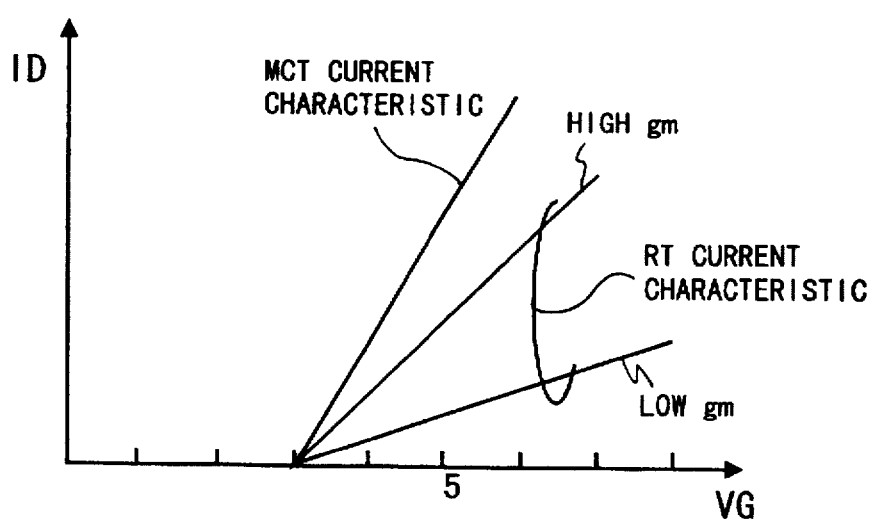
FIG. 3 is a diagram illustrating current characteristics of memory cell and reference cell transistors of the semiconductor storage device shown in FIG. 1.
Figure 7:
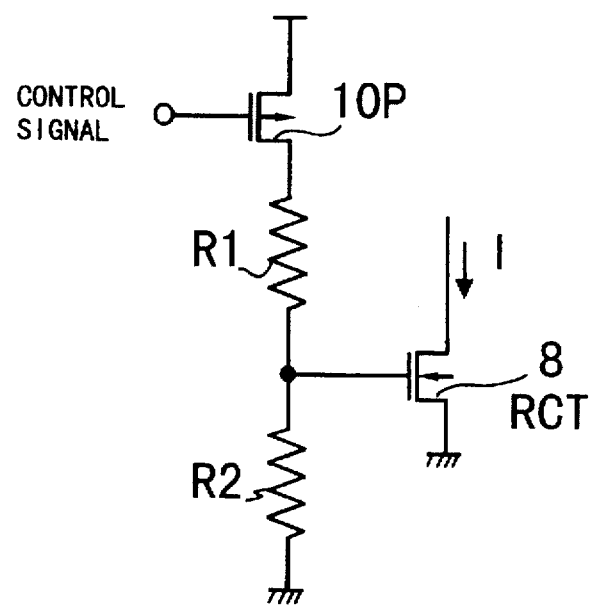
FIG. 7 is a circuit diagram of a conventional gate voltage generation circuit.

FIG. 3 is a diagram illustrating current characteristics of the memory cell and reference cell transistors. As seen from FIG. 3, in order to determine the current characteristics of the memory cell transistor 1 and the dummy memory cell transistor 4 of FIG. 1, particularly the current characteristic of the dummy memory cell transistor 4, the potential at the node d is set by voltage division by the capacitance elements C1 and C2. Consequently, if this voltage divider is compared with the conventional voltage divider described hereinabove with reference to FIG. 7 which is formed from resistor elements, the present voltage divider can be formed in a reduced size since no through-current flows. Accordingly, the chip size can be reduced and the current consumption can be reduced.

In particular, as seen from FIG. 3, in order to set the ID-VG characteristic of the dummy memory cell transistor 4 (in FIG. 3, different ID-VG characteristics are shown for a high value and a low value of gm) so that it may be substantially same as the minimum gate voltage (assumed to be 3 V here) characteristic for allowing on-current of the memory cell transistor 1 to flow, the capacitance ratio of the capacitance elements C1 and C2 is determined. By setting the capacitance ratio in this manner, the rise voltages (3 V) of the memory cell transistor 1 and the dummy memory cell transistor 4 can be made substantially equal to each other. It is to be noted that the adjustment of the slope of the current characteristic curve of the dummy memory cell transistor 4 can be made by varying a dimension of the dummy memory cell transistor 4 and the slope can be set arbitrarily by circuit designing.

Further, since the intermediate potential obtained by voltage division by the capacitance elements C1 and C2 is applied to the gate of the dummy memory cell transistor 4, the semiconductor storage device does not suffer from the problem that the current characteristic of the dummy memory cell transistor 4 does not exhibit a variation even after use over a long period of time, different from the conventional semiconductor storage device of FIG. 5 which employs the reference cell transistor 8 for which a same device is used as the memory cell transistor 1. Accordingly, the semiconductor storage device of the present embodiment eliminates the write circuit and the erase circuit for correction of the current characteristic of the reference cell transistor 8, and the chip size can be reduced as much.

Figure 4:
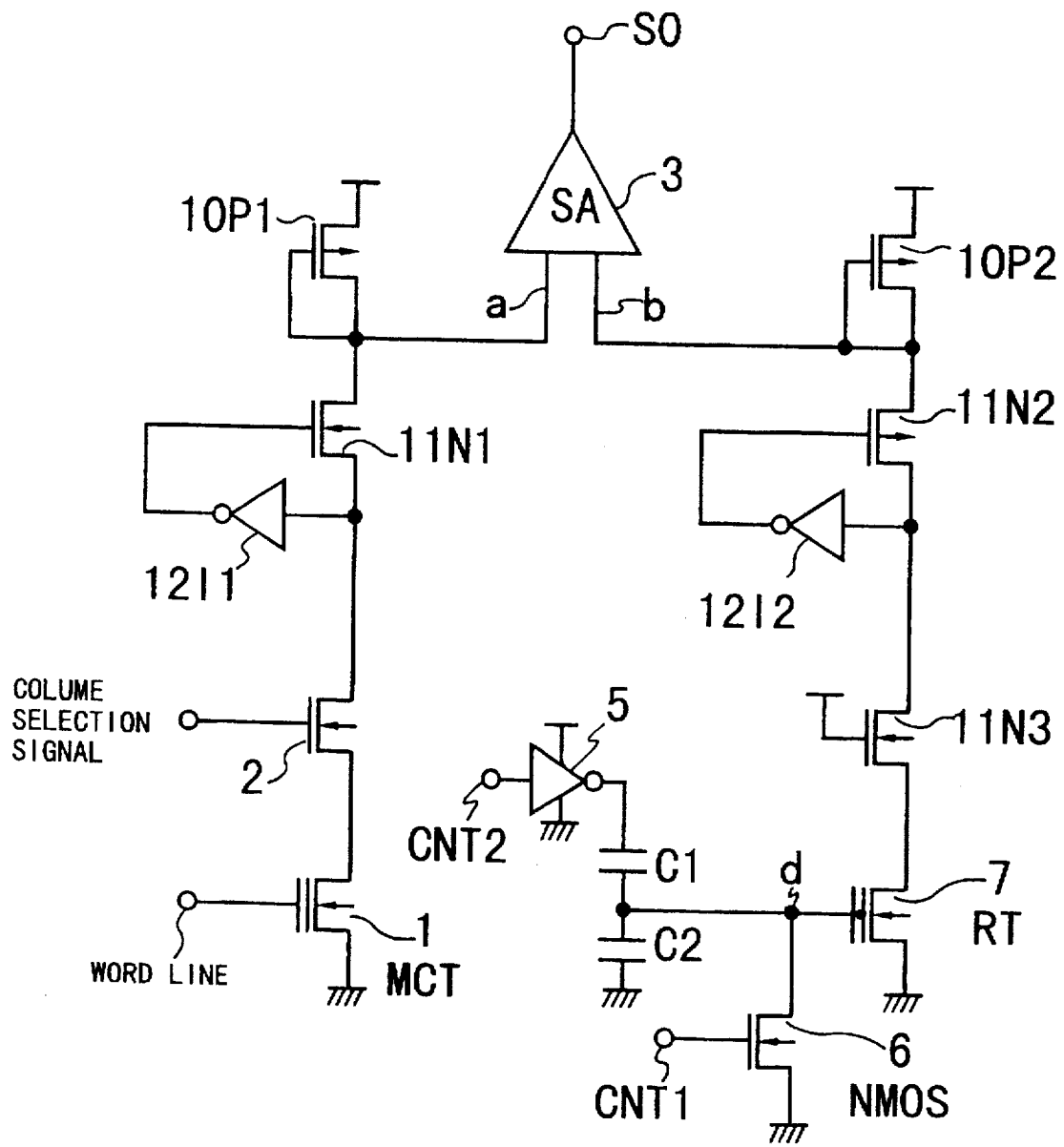
FIG. 4 is a circuit diagram of part of another semiconductor storage device to which the present invention is applied.

FIG. 4 shows in circuit diagram part of another semiconductor storage device to which the present invention is applied. Referring to FIG. 4, the semiconductor storage device shown is a modification to and includes common components with the semiconductor storage device of the first embodiment described above, and overlapping description of the common components is omitted here. The semiconductor storage device of the present embodiment is different from the semiconductor storage device of the first embodiment described above in that it employs a reference cell transistor 7 in place of the dummy memory cell transistor 4. For the reference cell transistor 7, an NMOS transistor of the stack gate type which is formed by a similar process to that of the memory cell transistor 1 is used. However, the control gate and the floating gate of the NMOS transistor of the stack gate type are short-circuited to each other so that the NMOS transistor of the stack gate type may function as an NMOS transistor of the single gate type.

In the semiconductor storage device of the present embodiment, since the reference cell transistor 7 which has a current characteristic nearer to the characteristic of the memory cell transistor 1 than that in the semiconductor storage device of the first embodiment is used for production of the reference side voltage VREF for the sense amplifier 3, a reading operation can be performed over a wider power supply voltage range, and a higher degree of reliability can be assured. Besides, since the floating gate and the control gate of the reference cell transistor 7 are short-circuited to each other, even after use over a long period of time, the reference cell transistor 7 does not exhibit a variation in current characteristic which is caused by injection of electrons or some other cause.

Having now fully described the invention, it will be apparent to one of ordinary skill in the art that many changes and modifications can be made thereto without departing from the spirit and scope of the invention as set forth herein.

What is claimed is:

1. A semiconductor storage device, comprising:
   a memory cell transistor formed from an NMOS transistor of the stack gate type having a floating gate, a word line signal being supplied to the gate of said memory cell transistor;
   a column selection transistor connected to said memory cell transistor, a column selection signal being supplied to the gate of said column selection transistor;
   first and second capacitance elements connected in series between a power supply and the ground;
   a reference transistor formed from an NMOS transistor of the single gate type, a potential at a junction between said first and second capacitance elements being supplied to the gate of said reference transistor in order to obtain a reference voltage from said reference transistor;
   a discharge transistor connected to the gate of said reference transistor; and
   a sense amplifier for comparing a voltage on said memory cell transistor side received via said column selection transistor with a voltage on said reference transistor side to differentially amplify the voltage on said memory cell transistor side;
   said first and second capacitance elements having capacitances which have a ratio substantially equal to a capacitance ratio of said memory cell transistor.

2. A semiconductor storage device as claimed in claim 1, wherein minimum gate voltages with which on-current flows through said memory cell transistor and said reference transistor are equal to each other.

3. A semiconductor storage device as claimed in claim 1, wherein said discharge transistor is formed from an NMOS transistor and operates with a first control signal supplied to the gate thereof while said first and second capacitance elements supply a high level or a low level of a second control via a control invertor to vary the potential at the junction between said first and second capacitance elements to control the gate voltage to said reference transistor.

4. A semiconductor storage device as claimed in claim 1, wherein said reference transistor is formed from an NMOS transistor of the stack gate type same as that of said memory cell transistor, and the control gate and the floating gate of said reference transistor are short-circuited to each other.

* * * * *